US011482452B2

(12) United States Patent
Yoon et al.

(10) Patent No.: US 11,482,452 B2
(45) Date of Patent: Oct. 25, 2022

(54) METHOD OF FORMING A CONTACT PLUG IN A SEMICONDUCTOR INTEGRATED CIRCUIT DEVICE

(71) Applicant: WONIK IPS CO., LTD., Pyeongtaek-si (KR)

(72) Inventors: Won Jun Yoon, Seoul (KR); Woo Hoon Sun, Osan-si (KR); Seok Kyu Choi, Suwon-si (KR); Tae Sung Han, Seoul (KR); Dong Woo Kim, Seoul (KR); Jin Wu Park, Hwaseong-si (KR)

(73) Assignee: WONIK IPS CO., LTD, Pyeongtaek-si (KR)

( * ) Notice: Subject to any disclaimer, the term of this patent is extended or adjusted under 35 U.S.C. 154(b) by 34 days.

(21) Appl. No.: 17/134,101

(22) Filed: Dec. 24, 2020

(65) Prior Publication Data
US 2022/0208605 A1 Jun. 30, 2022

(51) Int. Cl.
*H01L 21/768* (2006.01)
(52) U.S. Cl.
CPC .. *H01L 21/76876* (2013.01); *H01L 21/76877* (2013.01)
(58) Field of Classification Search
None
See application file for complete search history.

(56) References Cited

U.S. PATENT DOCUMENTS

| 7,589,017 | B2 * | 9/2009 | Chan | C23C 16/0281 |
| | | | | 438/681 |
| 8,551,885 | B2 * | 10/2013 | Chen | C23C 16/0281 |
| | | | | 118/715 |
| 2018/0053660 | A1 * | 2/2018 | Jandl | H01L 21/76816 |
| 2019/0326168 | A1 * | 10/2019 | Yang | H01L 27/10891 |

* cited by examiner

*Primary Examiner* — Bradley Smith
(74) *Attorney, Agent, or Firm* — William Park & Associates Ltd.

(57) ABSTRACT

In a method of forming a contact plug in a semiconductor integrated circuit device, the contact plug may be formed in a process chamber of a substrate-processing apparatus. The process chamber may have a process space. The process chamber may include a substrate supporter placed in a lower region of the process space to support a semiconductor substrate, and a gas injector placed in an upper region of the process space to inject a gas to the semiconductor substrate. An insulating interlayer having a contact hole may be formed on the semiconductor substrate loaded into the process space. A nucleation layer may be formed on an inner surface of the contact hole and an upper surface of the insulating interlayer. A semi-bulk layer may be formed on the nucleation layer in a lower region of the contact hole. An inhibiting layer may be formed on the semi-bulk layer and the exposed nucleation layer. A main-bulk layer may be formed on the semi-bulk layer to fill the contact hole with the main-bulk layer.

11 Claims, 7 Drawing Sheets

METHOD OF FORMING A CONTACT PLUG IN A SEMICONDUCTOR INTEGRATED CIRCUIT DEVICE

BACKGROUND

1. Technical Field

Various embodiments may generally relate to a method of manufacturing a semiconductor integrated circuit device, more particularly to a method of forming a contact plug in a semiconductor integrated circuit device.

2. Related Art

As a semiconductor integrated circuit device may have been highly integrated, needs of a contact plug having a high aspect ratio may be required. The contact plug having the high aspect ratio may be formed by forming a deep contact hole and by gap-filling the deep contact hole with a conductive layer.

However, in gap-filling the deep contact hole with the conductive layer, a void and/or a seam may be generated in the contact plug due to structural characteristics of the deep contact hole. The void and the seam in the contact plug may deteriorate electrical characteristics of interconnection layers.

SUMMARY

Example embodiments provide a method of forming a contact plug in a semiconductor integrated circuit device that may be capable of improving electrical characteristics of an interconnection layer.

In example embodiments of the present disclosure, according to a method of forming a contact plug in a semiconductor integrated circuit device, the contact plug may be formed in a process chamber of a substrate-processing apparatus. The process chamber may have a process space. The process chamber may include a substrate supporter placed in a lower region of the process space to support a semiconductor substrate, and a gas injector placed in an upper region of the process space to inject a gas to the semiconductor substrate. An insulating interlayer having a contact hole may be formed on the semiconductor substrate loaded into the process space. A nucleation layer may be formed on an inner surface of the contact hole and an upper surface of the insulating interlayer. A semi-bulk layer may be formed on the nucleation layer in a lower region of the contact hole. An inhibiting layer may be formed on the semi-bulk layer and the exposed nucleation layer. A main-bulk layer may be formed on the semi-bulk layer to fill the contact hole with the main-bulk layer.

In example embodiments of the present disclosure, according to a method of forming a contact plug in a semiconductor integrated circuit device, an insulating interlayer having a contact hole may be formed on a semiconductor substrate. A tungsten nucleation layer may be formed on an inner surface of the contact hole and an upper surface of the insulating interlayer. A semi-tungsten layer may be formed on the tungsten nucleation layer. The semi-tungsten layer and the exposed tungsten nucleation layer may be treated using a nitrogen radical to form an inhibiting layer. A main-tungsten layer may grow from surfaces of the semi-tungsten layer, the tungsten nucleation layer and the inhibiting layer to fill the contact hole with the main-tungsten layer. The main tungsten layer, the inhibiting layer and the tungsten nucleation layer may be planarized until a surface of the insulating interlayer may be exposed. The semi-tungsten layer may have a thickness for allowing an entrance of the contact hole to be exposed. The inhibiting layer may include a first portion having a first thickness on the insulating interlayer and a second portion having a second thickness on the inner surface of the contact hole. The first thickness may be thicker than the second thickness.

According to example embodiments, in forming the contact plug in the deep contact hole, the inhibiting layer may be formed on the upper surface of the insulating interlayer and the upper region in the inner surface of the contact hole to reduce a growth speed of the contact plug. Thus, the contact plug may be formed in the deep contact hole without a void and a seam.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
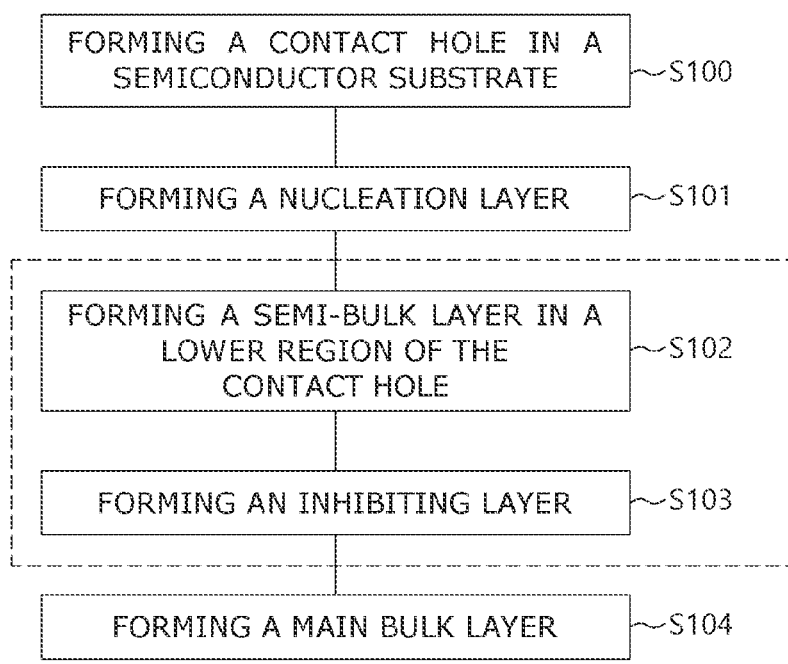
FIG. 1 is a flow chart illustrating a method of forming a contact plug in a semiconductor integrated circuit device in accordance with example embodiments.

FIG. 1 is a flow chart illustrating a method of forming a contact plug in a semiconductor integrated circuit device in accordance with example embodiments, and FIGS. 2 to 7 are cross-sectional views illustrating a method of forming a contact plug in a semiconductor integrated circuit device in accordance with example embodiments.

Figure 2:
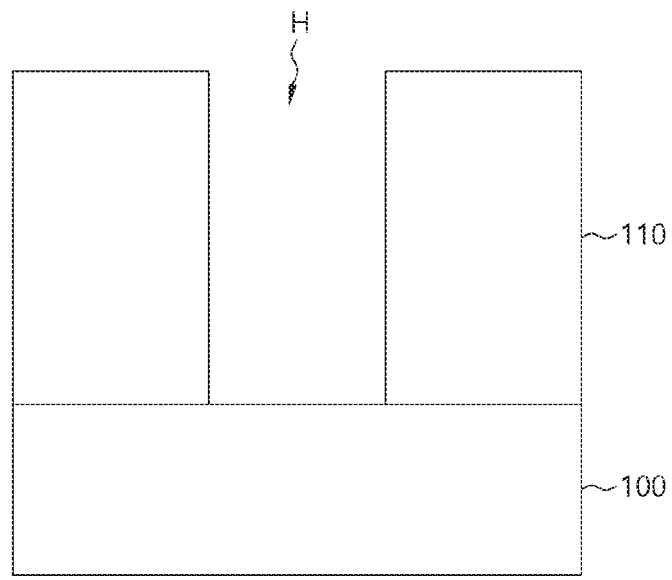
FIGS. 2 to 7 are cross-sectional views illustrating a method of forming a contact plug in a semiconductor integrated circuit device in accordance with example embodiments.
Figure 3:
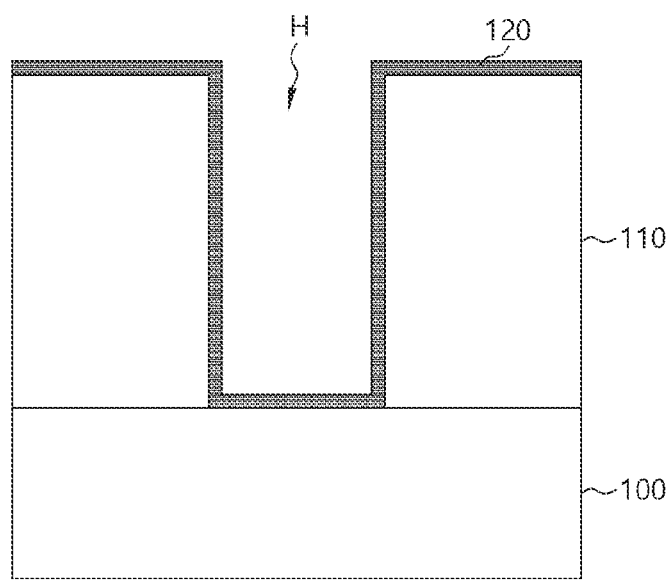

Referring to FIGS. 1 and 2, in step S100, a contact hole H may be formed in a semiconductor substrate 100. Particularly, an insulating interlayer 110 may be formed on the semiconductor substrate 100 with circuit layers. The insulating interlayer 110 may include a plurality of insulation layers. Alternately, the insulation layer 110 may include an insulation layers including a conductive layer therein. The insulating interlayer 110 may be etched so that a portion on the semiconductor substrate 100 may be exposed to form the contact hole H. The contact hole H may have a width and a depth greater than the width. That is, the contact hole H may have a high aspect ratio. The portion of the semiconductor substrate 100 exposed through the contact hole H may correspond to a conductive region formed on the semiconductor substrate 100.

Figure 4:
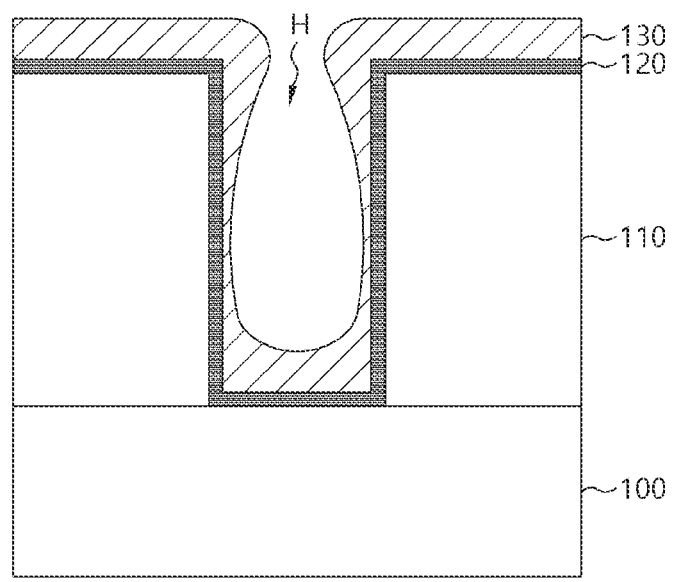

Referring to FIGS. 1, 2 and 4, in step S101, a nucleation layer 120 may be formed on the semiconductor substrate 100. The nucleation layer 120 may be formed by an atomic layer deposition (ALD) process using a silicon source and a tungsten source. The silicon source may include $SiH_4$, $B_2H_6$, etc. The tungsten source may include WF6. The nucleation layer 120 may have a uniform thickness along an upper surface of the insulating interlayer 110 and an inner surface of the contact hole H. For example, the nucleation layer 120 may have a thickness of about 5 nm to about 15 nm. In example embodiments, the nucleation layer 120 may be formed by the ALD process, not restricted within a specific process.

Referring to FIGS. 1 and 4, in step S102, a semi-bulk layer 130 may be formed in a lower region of the contact hole H. The semi-bulk layer 130 may be formed from the nucleation layer 120. The semi-bulk layer 130 may have a thickness of about 10% to about 30% of an entrance width of the contact hole H. The semi-bulk layer 130 may be formed by a reaction between a silicon source and a tungsten source. The semi-bulk layer 130 may be formed using an ALD apparatus, a plasma-enhanced ALD (PEALD) apparatus, a chemical vapor deposition (CVD) apparatus, a PECVD apparatus, etc. The semi-bulk layer 130 may be formed by supplying the silicon source and the tungsten source for about 1 second to about 10 seconds.

Figure 5:
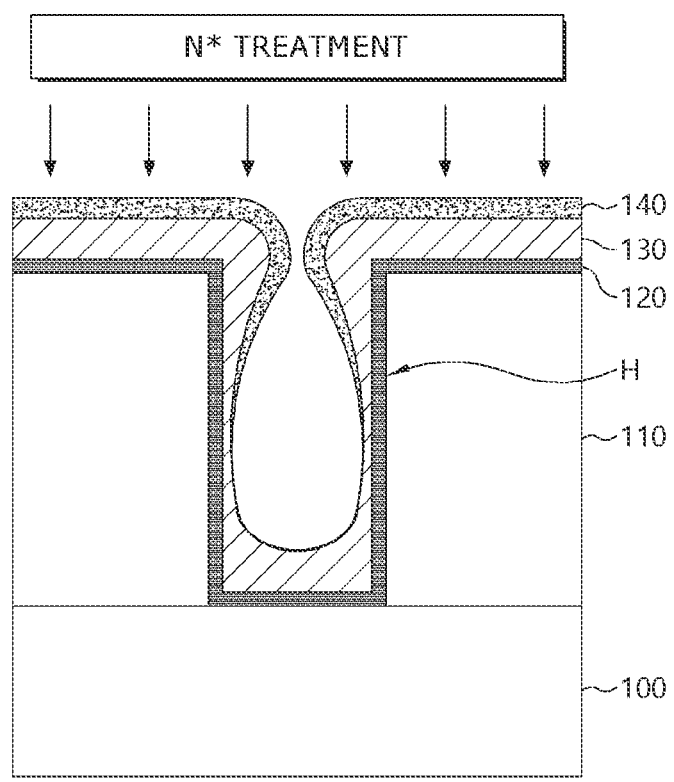

Referring to FIGS. 1 and 5, in step S103, an inhibiting layer 140 may be formed on the semiconductor substrate 100 with the semi-bulk layer 130. For example, the inhibiting layer 140 may be formed by processing the upper surface of the semiconductor substrate 100 with the semi-bulk layer 130 using nitrogen radicals N*. The nitrogen radicals N* may be obtained by activating a nitrogen gas using a remote plasma generator (RPG). The nitrogen radical N* treatment may be performed in the PECVD apparatus.

Figure 8:
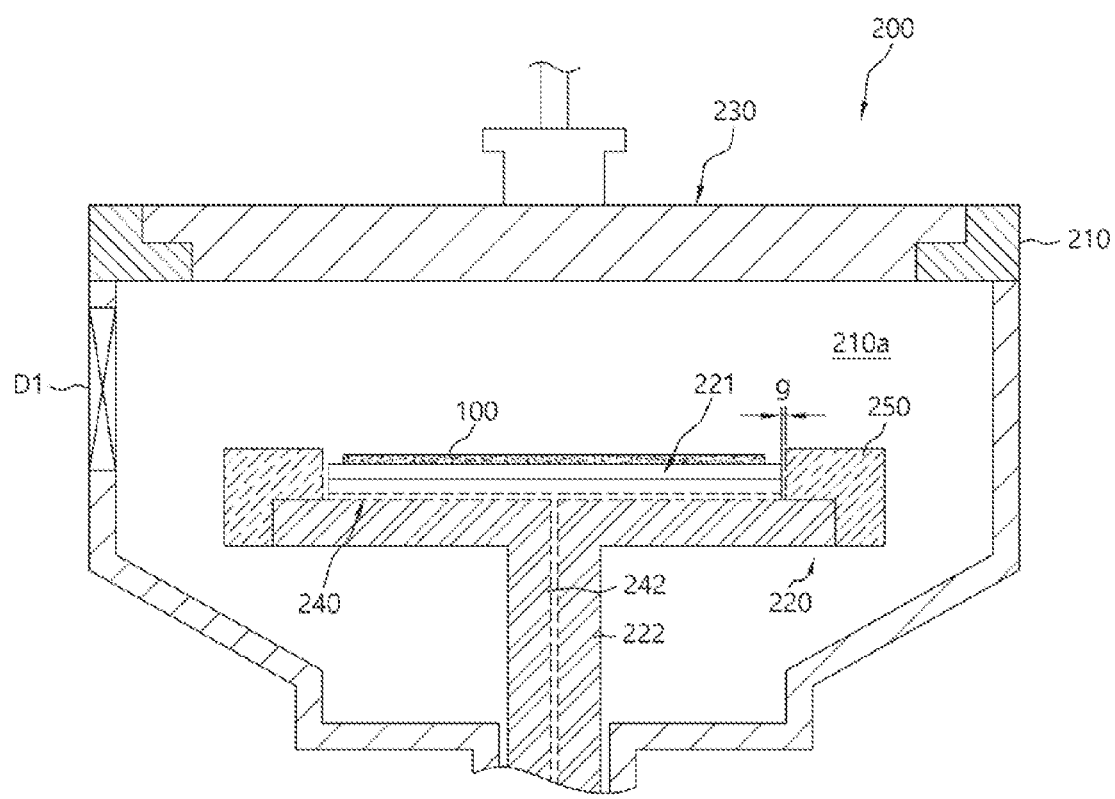
FIG. 8 is a cross-sectional view illustrating a PECVD apparatus in accordance with example embodiments.

FIG. 8 is a cross-sectional view illustrating a PECVD apparatus in accordance with example embodiments.

Referring to FIG. 8, the PECVD apparatus 200 may include a vacuum chamber 210 configured to define a process region 210a. A substrate supporter 220 configured to support the semiconductor substrate 100 may be arranged in the vacuum chamber 210. The substrate supporter 220 may include a heater configured to heat the semiconductor substrate 100.

A showerhead 230 may be installed at a ceiling of the process region 210a. The showerhead 230 may be configured to inject a process gas including a source gas and a reaction gas to the process region 210a. The showerhead 230 may include a plurality of injection holes configured to inject the process gas to the substrate supporter 220.

The substrate support 220 may include a stage 221 and a hollow support 222. The stage 221 may be configured to receive the semiconductor substrate 200. The hollow support 222 may be positioned a central bottom portion of the stage 221 to support the stage 221. A passageway 242 may be formed in a central portion of the hollow support 222. A deposition-preventing gas may be supplied through the passageway 242. Hereinafter, the passageway 242 may be referred to as a deposition-preventing gas transfer passageway.

An edge gas passageway 240 may be formed in the substrate supporter 220. The edge gas passageway 240 may be connected to the deposition-preventing gas transfer passageway 242 in the hollow support 222. The deposition-preventing gas may include an Ar gas. Hereinafter, the deposition-preventing gas may be referred to as an edge gas.

An edge ring 250 may be installed at an upper edge portion of the substrate supporter 220. The edge ring 250 may be configured to support the semiconductor substrate 100. The edge ring 250 may be spaced apart from the stage 221 by a gap g so that the edge gas may be supplied onto the semiconductor substrate 100 through the gap. In FIG. 8, a reference numeral D1 may indicate a door through which the semiconductor substrate 100 may be loaded and unloaded.

The nitrogen gas may be supplied to the remote plasma generator (not shown). The nitrogen radicals N* activated by the plasma may be absorbed on the surface of the semiconductor substrate 100. This process may be a nitrogen treatment process. Because the contact hole H of the semiconductor substrate 100 has the high aspect ratio, the nitrogen radicals N* may mainly be absorbed on the upper surface of the insulating interlayer 110 and an upper portion of the inner surface of the contact hole H adjacent to the showerhead 230. In contrast, viewed from a mean free path of the nitrogen radicals N*, the nitrogen radicals N* may not reach to an upper surface of the semi-bulk layer 130 and a lower portion of the inner surface of the contact hole H remote from the showerhead 230. Although the nitrogen radicals N* may reach to the upper surface of the semi-bulk layer 130 and the lower portion of the inner surface of the contact hole H, a tiny amount of the nitrogen radicals N* may be absorbed on the upper surface of the semi-bulk layer 130 and the lower portion of the inner surface of the contact hole H.

The nitrogen radicals N* may be reacted with tungsten in the nucleation layer 120 and the semi-bulk layer 130 to form an inhibiting layer 140. The nucleation layer 120 and the semi-bulk layer 130 may be generated by a following reaction formula.

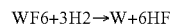

$$WF6+3H2 \rightarrow W+6HF$$

Further, the nucleation layer 120 and the semi-bulk layer 130 may be reacted with the nitrogen radicals N* to form the inhibiting layer 140 including tungsten nitride (WN). When a main bulk layer, for example, a main tungsten layer may be formed by a following process, nitrogen in the inhibiting layer 140 may inhibit an ionization of H2 to delay a deposition rate of the main bulk layer on a portion of the inhibiting layer 140 having a relatively thick thickness. Thus, a deposition rate in the upper region of the contact hole H may be delayed compared than a deposition rate in the lower region of the contact hole H.

For example, when the nitrogen radicals N* may be supplied, the edge gas may be supplied through the gas transfer passageway 242. The edge gas may function as to prevent the nitrogen gas from infiltrating into the gap between the semiconductor substrate 100 and the substrate supporter 220 during forming the inhibiting layer 140. Further, the edge gas may also be supplied in forming the nucleation layer, the semi-bulk layer and the main-bulk layer to prevent a layer having uneven thicknesses on a lower surface of the semiconductor substrate 100.

Figure 6:
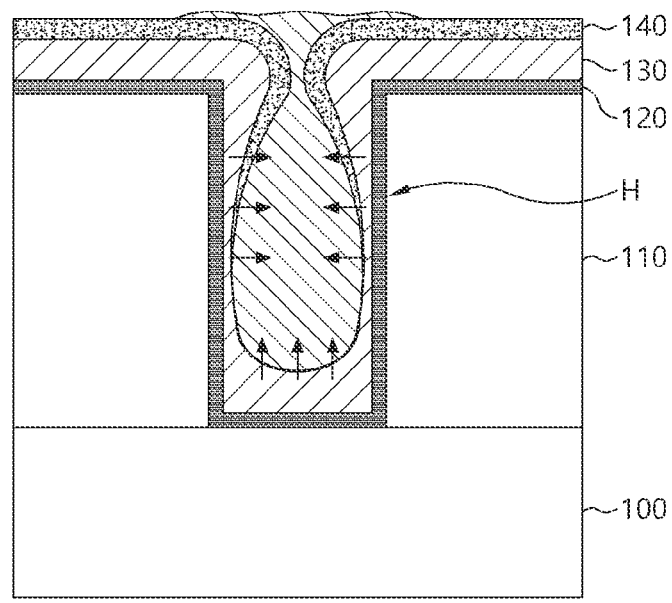

Referring to FIGS. 1 and 6, in step S104, the contact hole H may be filled with the main bulk layer 150 by an in-situ process in the PECVD apparatus 200. The main bulk layer 150 may include tungsten. The main bulk layer 150 may be formed by a silicon source and a tungsten source through the showerhead 230. The silicon source may include SiH6, B2H6, etc. The tungsten source may include WF6, etc.

The main bulk layer 150 including the tungsten may grow from the nucleation layer 120 and the semi-bulk layer 130 including the same material. Thus, a tungsten growth on the inhibiting layer 140 including nitrogen may be delayed.

Therefore, during the main bulk layer 150 may grow from the upper surface of the semi-bulk layer 130 and a side surface of the nucleation layer 120 in the contact hole H, the growth of the main bulk layer 150 on the upper inner surface of the contact hole H and the upper surface of the insulating interlayer 110 around the contact hole H may be delayed. Because the growth of the main bulk layer 150 on the upper inner surface of the contact hole H and the upper surface of the insulating interlayer 110 around the contact hole H may be delayed, the main bulk layer 150 may sequentially grow from the upper surface of the semi-bulk layer 130 and the lower inner surface of the contact hole H to form the main bulk layer 150 without the void and the seam in the contact hole H.

Figure 9:
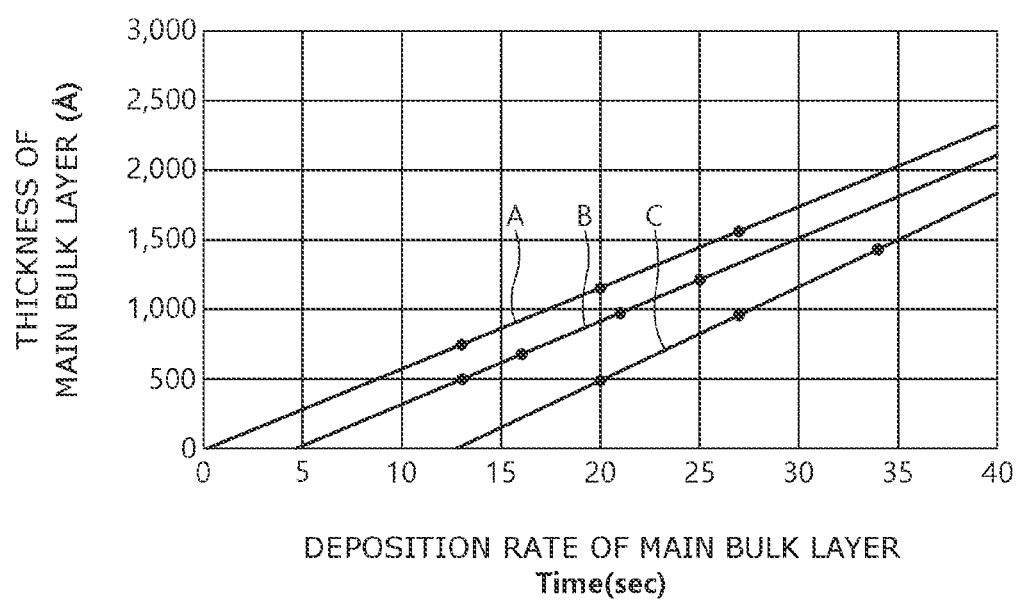
FIG. 9 is a graph showing a deposition speed of a main bulk layer in accordance with example embodiments.

FIG. 9 is a graph showing a deposition speed of a main bulk layer in accordance with example embodiments.

In FIG. 9, a line "A" may represent a deposition rate of a main bulk layer when a conductive layer may be a nucleation layer-main bulk layer structure. A line "B" may represent a deposition rate of a main bulk layer when a conductive layer may be a nucleation layer-semi-bulk layer-inhibiting layer-main bulk layer structure. A line "C" may represent a deposition rate of a main bulk layer when a conductive layer may be a nucleation layer-inhibiting layer-main bulk layer structure.

As shown in FIG. 9, it can be noted that the deposition rate represented by the line "B" may be delayed by about four 20 seconds than the deposition rate represented by the line "A". Further, it can be noted that the deposition rate represented by the line "C" may be delayed by about nine seconds than the deposition rate represented by the line "A".

The deposition rate represented by the line "B" may be measured by depositing the main bulk layer 150 on the semi-bulk layer 130. The deposition rate represented by the line "C" may be measured by depositing the main bulk layer 150 on the inhibiting layer 140 over the insulating interlayer 110. As shown the above deposition rates, the deposition rate of the main bulk layer 150 on the upper surface of the insulating interlayer 110 and the upper inner surface of the contact hole H may be delayed than that of the main bulk layer 150 on the semi-bulk layer 130 to reduce the seam and the void.

Figure 7:
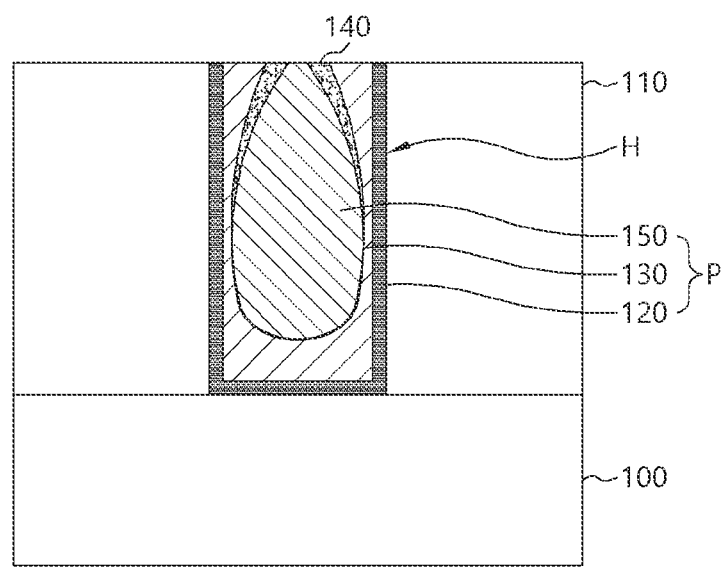

Referring to FIG. 7, the main bulk layer 150 may be planarized until the upper surface of the insulating interlayer 110 may be exposed to form a contact plug P including the semi-bulk layer 130 and the main bulk layer 150 in the contact hole H.

According to example embodiments, in forming the contact plug in the deep contact hole, the inhibiting layer may be formed on the upper surface of the insulating interlayer and the upper region in the inner surface of the contact hole to reduce a growth speed of the contact plug. Thus, the contact plug may be formed in the deep contact hole without a void and a seam.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A method of forming a contact plug in a semiconductor integrated circuit device, the method comprising:
    providing a semiconductor substrate loaded into a process chamber, the semiconductor substrate including a first surface in which an insulating interlayer having a contact hole is formed and a second surface opposite to the first surface;
    forming a nucleation layer on an inner surface of the contact hole and an upper surface of the insulating interlayer, the inner surface of the contact hole including a bottom surface, a lower sidewall extending from an edge of the bottom surface and an upper sidewall extending from the lower sidewall;
    forming a semi-bulk layer on the nucleation layer to have a thickness enough not to block an entrance of the contact hole, wherein a thickness of the semi-bulk layer formed on the bottom surface is thicker than that of the semi-bulk layer formed on the lower sidewall;
    forming an inhibiting layer on a selected portion of the semi-bulk layer and an exposed portion of the nucleation layer; and
    forming a main bulk layer on the semi-bulk layer to fill the contact hole with the main bulk layer.

2. The method of claim 1, wherein forming the nucleation layer comprises supplying a hydrogen source and a tungsten source by an atomic layer deposition (ALD) process.

3. The method of claim 1, wherein forming the inhibiting layer comprises treating the semi-bulk layer on the upper sidewall of the contact hole and the upper surface of the insulating interlayer using nitrogen radicals by a Plasma Enhanced Chemical Vapor Deposition (PECVD) process to react the nitrogen radicals with the semi-bulk layer.

4. The method of claim 1, further comprising:
    supplying an edge gas so as not to generate the inhibiting layer on the second surface of the semiconductor substrate.

5. The method of claim 4, wherein the edge gas comprises an Ar gas.

6. The method of claim 1, wherein the inhibiting layer comprises tungsten nitride.

7. The method of claim 1, wherein forming the main bulk layer and forming the inhibiting layer are performed in the process chamber by an in-situ process.

8. The method of claim 1, wherein forming the main bulk layer comprises reacting a nitrogen source with a tungsten source.

9. A method of forming a contact plug in a semiconductor integrated circuit device, the method comprising:
    forming an insulating interlayer having a contact hole on a first surface of a semiconductor substrate;
    forming a tungsten nucleation layer on an inner surface of the contact hole and an upper surface of the insulating interlayer, the inner surface of the contact hole;
    forming a semi-tungsten layer on the tungsten nucleation layer, to have uneven thicknesses;
    treating the semi-tungsten layer and the exposed tungsten nucleation layer using nitrogen radicals to form an inhibiting layer;

forming a main tungsten layer on the semi-tungsten layer, the tungsten nucleation layer and the inhibiting layer to fill the contact hole with the main bulk layer; and planarizing the main tungsten layer, the inhibiting layer and the tungsten nucleation layer to expose the upper surface of the insulating interlayer;

wherein the semi-tungsten layer has a thickness for allowing an entrance of the contact hole to be exposed, and wherein a deposition rate of the main tungsten layer of an upper region of the contact hole is lowered compared to a deposition rate of a lower region of the contact hole.

10. The method of claim 9, further comprising:

supplying an edge gas so as not to generate the inhibiting layer on a second surface of the semiconductor substrate, the second surface being opposite to the first surface.

11. The method of claim 10, wherein the edge gas comprises an Ar gas.

\* \* \* \* \*